United States Patent [19]

Thomson

[11] Patent Number: 4,983,843

[45] Date of Patent: Jan. 8, 1991

[54] RADON DETECTOR

[76] Inventor: Ian Thomson, 9 Nesbitt St., Nepean, Ontario, Canada, K2H 8C4

[21] Appl. No.: 342,336

[22] Filed: Apr. 24, 1989

[30] Foreign Application Priority Data

May 27, 1988 [CA] Canada ................................ 567998

[51] Int. Cl.⁵ ...................... G01T 1/02; H01L 31/115
[52] U.S. Cl. ............................... 250/370.02; 250/253; 250/255; 250/370.01; 357/29
[58] Field of Search ...................... 250/370.02, 370.01, 250/255, 253; 357/30 G, 29

[56] References Cited

U.S. PATENT DOCUMENTS 4,641,165 2/1987 Iizuka et al. ...................... 357/23.6
4,680,471 7/1987 Morris et al. .................. 250/370.14

OTHER PUBLICATIONS

A.K.M.M. Haque, J. Yates and D. Stevens, "Soft Errors in Dynamic Random Access Memories—A Basis For Dosimetry." Published by Polytechnic of the South Bank, London, England SE10AA, (Unknown date), Abstract, pp. 1-12 and 4 figures.

J.C. Lund, F. Sinclair and G. Entine, "Neutron Dosimeter Using a Dynamic Random Access Memory as a Sensor," *IEEE Transactions on Nuclear Science*, vol. 33, No. 1 (Feb. 1986), pp. 620-623.

Patrick J. Winters, "The Radiation Soft Dynamic RAM as a Particle Detector," *IEEE Nuclear Science Symposium (Oct. 1982)*.

IS256 OpticRAM ™ 262,144 Element Solid-State Image Sensor, Published by Micron Technology, Inc., Boise, Idaho, Rev. 2 (effective 3-1-86).

J. Bigu and R. Raz, "Passive Radon/Thoron Personal Dosimeter Using an Electrostatic Collector and a Diffused-Junction Detector," *Review of Scientific Instruments*, vol. 58, No. 1 (Jan. 1985), pp. 146-153, Copyright © 1985 American Institute of Physics.

Timothy C. May and Murray H. Woods "Alpha-Particle-Induced Soft Errors in Dynamic Memories", *IEEE Transactions on Electron Devices*, vol. ED-26, No. 1 (Jan. 1979), pp. 2-9.

*Primary Examiner*—Constantine Hannaher
*Attorney, Agent, or Firm*—Pascal & Associates

[57] ABSTRACT

A radon gas detector instrument comprising: a filter for trapping alpha radon daughters of said gas, an air pump for drawing ambient air through the filter, a DRAM devoid of an alpha particle barrier layer, located adjacent the filter, for exposure to alpha particles trapped by the filter, apparatus for cyclically relaxing all cells of the DRAM, waiting for a significant period of time for cells of the DRAM to become charged by said alpha particles, then reading the DRAM to determine the number of charged cells in the DRAM, a display connected to the relaxing, waiting and reading means for displaying a count of the number of charged cells in units correlated to the intensity of radon gas in the ambient air.

21 Claims, 5 Drawing Sheets

RADON DETECTOR

This invention relates to a radon detector, and particularly to one which is portable, can be made at low cost and is easily used in the field, homes, and buildings.

Radon, a radioactive gas, has been considered as a significant health hazard for miners. In recent years it has become evident that the health hazard is not confined only to mines, but also exists in homes and other buildings, especially where there is little ventilation and little exchange of air with the outside.

Detection of radon gas levels to an accurate degree has typically been done using a track-etch alpha particle sensitive film as a detector and a battery operated pump to deposit the radon daughter products on a filter close to the alpha sensitive film. The film is read at a later date by etching and counting tracks with a non-portable system.

An all-electronic method which promises to be portable and rugged uses a silicon diode as the alpha detector and a passive or active pump to deposit the radon or its daughter products into close proximity to the detector.

The track-etch method is a post-facto determination technique which has the limitation that it cannot give an immediate reading to radiation exposure. This limits its application and reading speed. It also cannot output an alarm at the time of detection. Although the track-etch detector itself is inexpensive, the reading system is expensive. The system is thus not feasible for use in a relatively real time environment, for widespread public use, or in an environment in which an alarm must be sounded at the time that high radon levels are present.

In the silicon diode detector structure, the detector itself typically costs in the range of about $200.00 to $1,000.00. Clearly this is a prohibitive cost for widespread use. In addition, amplification and pulse-shaping circuitry is usually required to count the pulses caused by alpha particles hitting the detector. Thus the power requirements are high, and the size and cost of the instrument is also high. Commercial instruments based on this system are large and heavy, generally due to the required weight of the batteries required to power the circuit.

The present invention uses a digital silicon integrated circuit device which is of the type known to be sensitive to alpha particles, as an alpha particle detector This device is a dynamic random access memory (DRAM) which is commercially available at present for under $5.00, (see SOFT ERRORS IN DYNAMIC RANDOM ACCESS MEMORIES—A BASIS FOR DOSIMETRY by A.K.M.M. Haque et al, Polytechnic of the South Bank, London, England, SE1 0AA; NEUTRON DOSIMETER USING A DYNAMIC RANDOM ACCESS MEMORY AS A SENSOR, by J.C. Lund et al, published in IEEE Transactions on Nuclear Science, volume 33, No. 1, Feb. 1986, p. 620–623, and RADIATION SOFT DYNAMIC RAM AS A PARTICLE DETECTOR by Patrick J. Winters, published in the IEEE Nuclear Science Symposium, Oct. 1982).

While the use of a DRAM as an alpha particle detector has been previously proposed, several characteristics of such a device render it highly inefficient for use in a radon detector It was found that DRAMS could not be used with reliability to store data due to their susceptibility to environmental ionizing radiation, which randomly changes the data stored therein. Accordingly DRAMs are manufactured with a surface polyimide layer to absorb such radiation (primarily alpha particles) before they can reach the substrate of the DRAM. In order to error-correct stored data corrupted by alpha particles, DRAMs are fabricated so as to store data in an encoded manner. Thus, for example, where a DRAM would be empty of data, this state would be stored with one-half the DRAM cells containing "1"s and one-half containing "0"s. Error checking is used to decode the output and thus determine whether ionizing radiation-caused so-called "soft errors" have occurred, and correction is effected in the next refresh cycle.

In addition, such memories are prone to lose stored data through leakage. Accordingly the DRAMs are refreshed regularly at a fractional rate of the system clock. With the refresh, alpha particle absorption, and error trapping, DRAMs have become a very widely used memory device in computer systems Thus commercial DRAMs are unsuitable for the present invention. An ionizing particle passing into the device would place charge into the memory cell of the DRAM, changing the relaxed cell from storing a "1" to a "0". Since half the cells already normally contain "0"s (in an empty DRAM), the efficiency is reduced by 50%.

Further, each refresh cycle in a system does not allow enough time for a particle count to be established. Error checking circuitry would eliminate the effect of the ionizing particle, and the alpha particle absorbing layer would substantially reduce the quantity of particles detected The present invention utilizes a DRAM which is manufactured with no surface polyimide or other alpha particle blocking layer, or which has the surface polyimide layer or other alpha particle blocking layer of an already existing DRAM removed. The DRAM is prepared for sensing by relaxing (storing "1"s) in every cell of the DRAM, rather than storing "1"s in some and "0"s in other cells as is currently done in order to exhibit an entirely empty DRAM. The DRAM is then exposed to alpha particles, e.g. by exposing it to daughter products of radon collected on a filter over which ambient air has been passed. The DRAM is then read. A significant interval of time (e.g. one second), which is much longer than the normal refresh cycle, is allowed to lapse before the DRAM is read and thereby refreshed.

The result is an ionizing radiation particle detector, an alpha particle detector, or a radon gas detector which is highly efficient, very low cost, and operates in real time. Because of the nature of the detector, it can be read digitally, allowing the use of CMOS operation circuits, which utilize very little battery current As a result the detector can be made to be light and portable, and widely used in a real time commercial environment.

In general, for use in an ionizing radiation particle detector, one embodiment of the invention is comprised of a dynamic random access memory (DRAM) having no surface polyimide or other ionizing particle protection layer, for exposure to the particles. Means is provided for relaxing all actual cells of the DRAM which are to be used to detect the particles, and further means is provided for reading the cells of the DRAM after exposure thereof to the alpha particles.

Another embodiment of the invention is a method of detecting alpha particles comprising relaxing all cells of a DRAM having no surface radiation particle absorbing layer, waiting for a significant period of time before refreshing, while alpha particle hits charge some cells of the DRAM, reading the DRAM content to register the number of charged cells, and repeating these steps cyclically. The number of charged cells read is then provided to a display, which displays a value preferably in units correlated to the intensity of the radon gas in the ambient air.

According to another embodiment the invention is a radon gas detector instrument comprising a filter for trapping radon daughters such as Radium A (RaA) or Radium C' (RaC') from the gas, which emit alpha particles, an air pump for drawing ambient air through the filter, a DRAM devoid of an alpha particle barrier layer, located adjacent the filter, for exposure to radon daughters trapped by the filter, a circuit for cyclically relaxing all cells of the DRAM, waiting for a significant period of time for cells of the DRAM to become charged by the alpha particles, then reading the DRAM to determine the number of charged cells in the DRAM. A display displays a count of the number of charged cells in units correlated to the intensity of the radon gas in the ambient air.

Preferably the DRAM is covered by a MYLAR TM (trade mark of E.I. duPont de Nemours and Co. Inc.) polyester film cover, to act as protective cover but allowing alpha particles to penetrate to the DRAM silicon material A MYLAR TM polyester film cover thickness of about 12 microns has been found to work satisfactorily.

A better understanding of the invention will be obtained by reference to the detailed description below, in conjunction with the following figures, in which.

Figure 1:
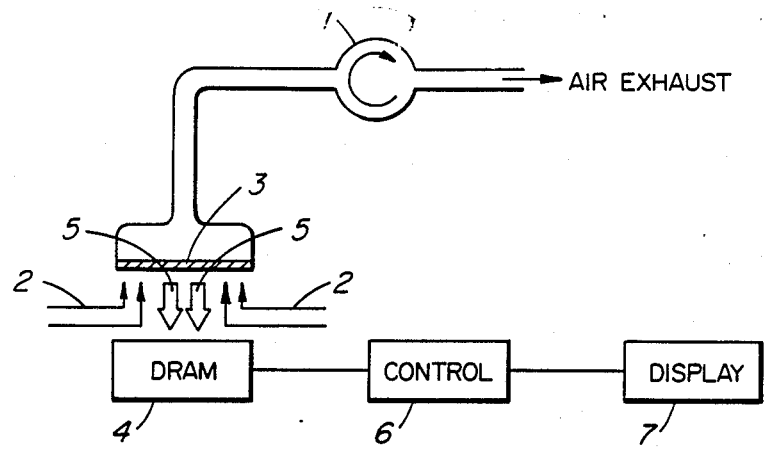
FIG. 1 illustrates a block schematic of the invention.
Figure 3:
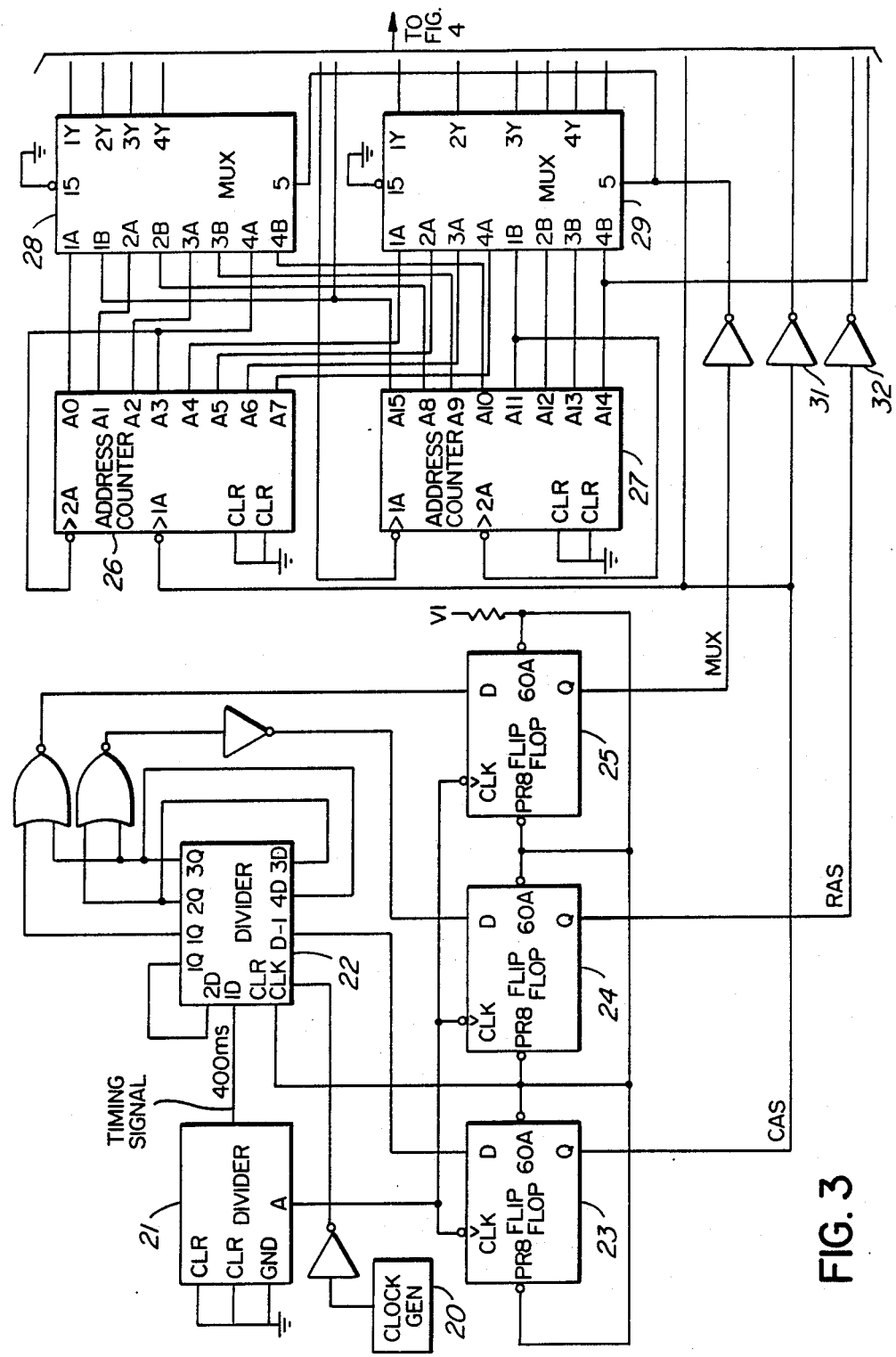
Figure 4:
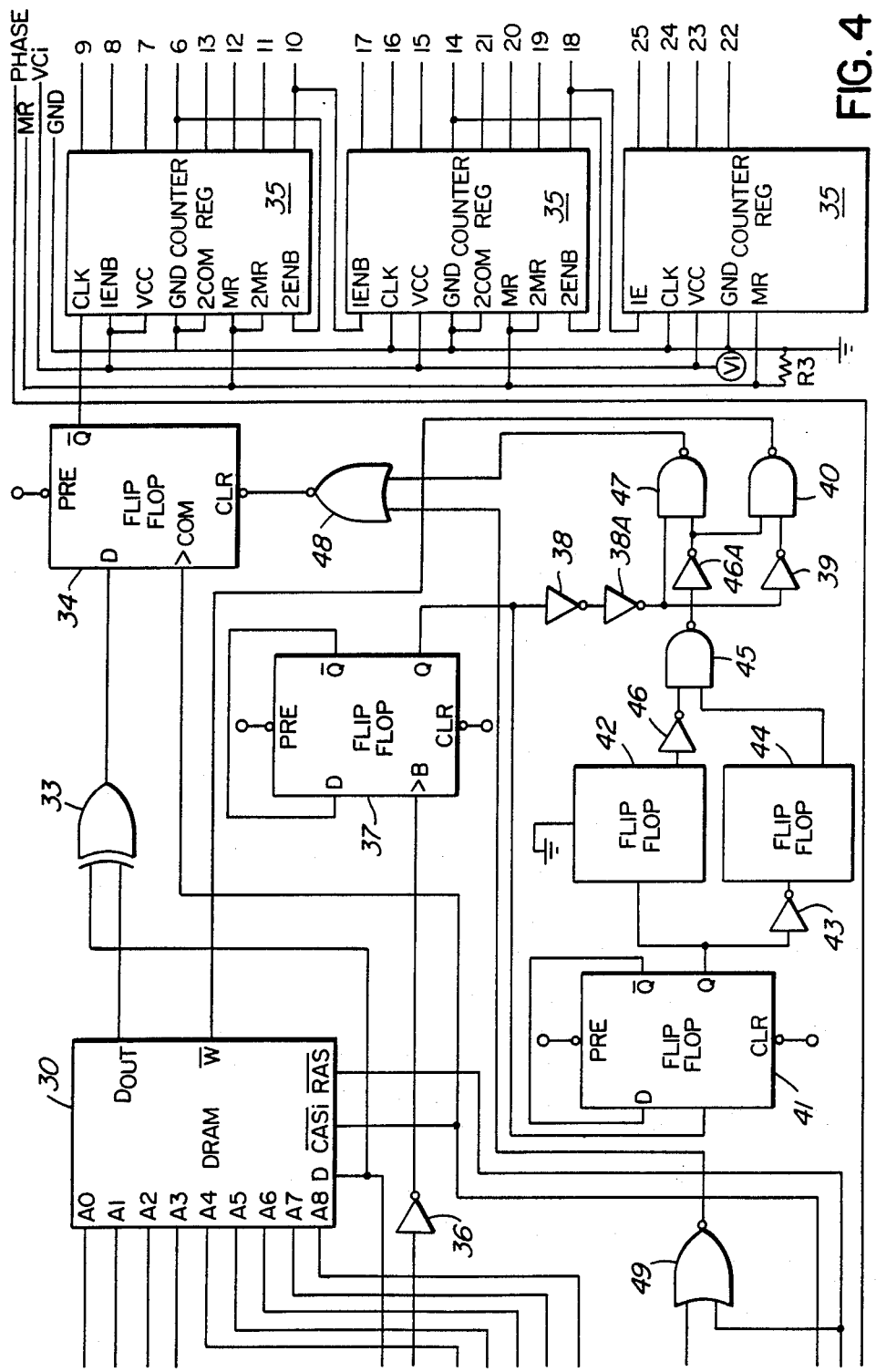
Figure 5:
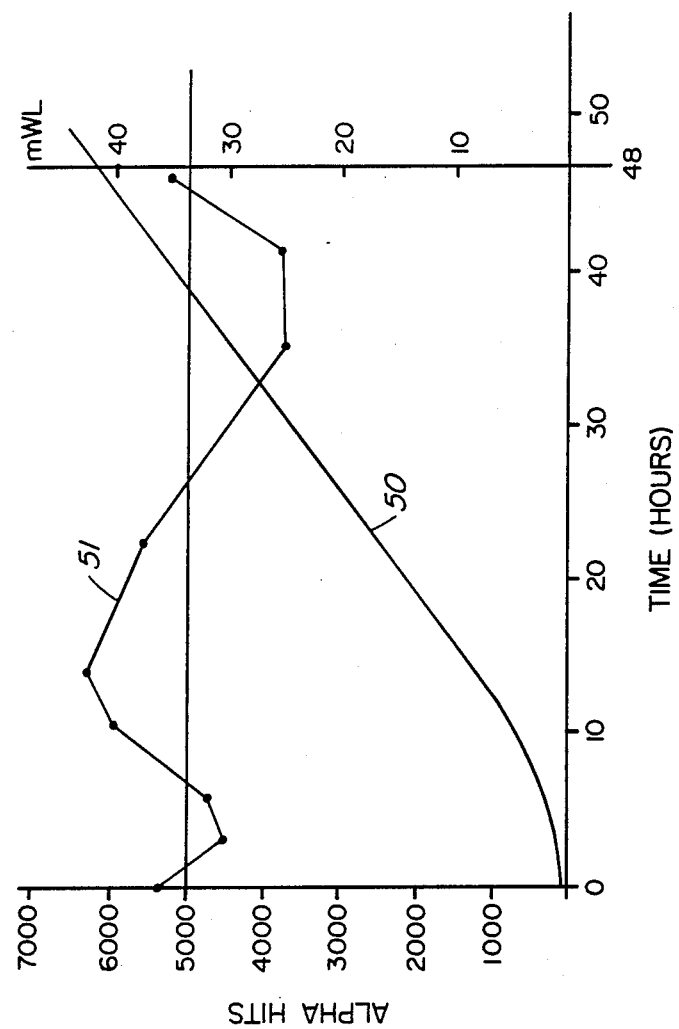
Figure 6:
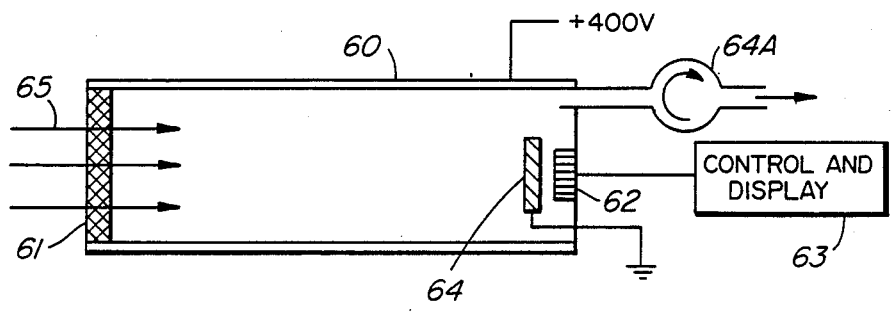
Figure 7:
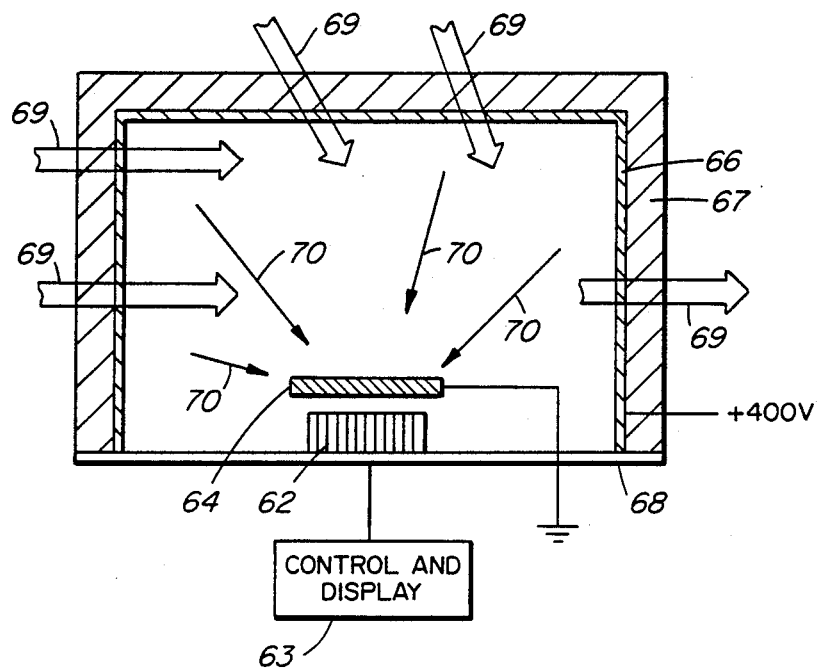

FIGS. 3 and 4 placed together form a schematic of a major portion of the invention, FIG. 5 is a graph of detected alpha bits with time (for radon daughters), FIG. 6 is an actual view of another embodiment of the invention, and FIG. 7 is a sectional view of still another embodiment of the invention Turning to FIG. 1, a pump 1 draws air 2 in which the radon daughter content is to be determined past a micro-pore filter 3 having, for example, a pore size of about 0.8 microns. Daughter products of the radon gas are deposited on the filter and these emit alpha particles. A DRAM 4 of the type described herein is located with its active surface facing the filter 3, located sufficiently close that "hits" from the alpha particles emitted by the radon daughter products retained on the filter impinge thereon, but sufficiently far that air 2 is allowed to pass to filter 3. The filter can have a diameter of e.g. 1 centimeter, and the spacing between the filter and the DRAM can be e.g. 3 millimeters. The alpha particle radiation impinging on the DRAM is shown as arrows 5.

The DRAM is connected to a control circuit 6, which is connected to a display 7.

During operation, in each cycle the control loads the DRAM with "1"s (all cells relaxed) reads the DRAM to ensure that all cells are relaxed (refreshing it) then suspends reading and refreshing for a significant interval of time (for example 1 second), to allow alpha hits to accumulate. The control then reads the DRAM digitally, determining how many cells have been charged by the alpha hits. This also refreshes the DRAM. The DRAM reading is stored in one or more counter registers, which are accessed by display 7, which displays the reading in useful units correlated to the intensity of radon daughters in the ambient air, for example mWL (milliworking level). To this end a calibration factor (units of counts per hour per mWL) is applied to the displayed counts to obtain an indication of mWL.

The control then reloads the DRAM with "1"s, relaxing each cell, in preparation for a repetition of the same cycle. After again reading the "hits", evidenced by the DRAM having changed the data stored in those hit cells from 1s to 0s, the display can be updated. In this application the logic level 1 represents the cell discharged status, and the logic level O represents the cell charged status.

It will be noted that filter 3 accumulates radon daughter products which emit alpha particles. Therefore the intensity of the alpha hits will increase in time, due to continuous accumulation of the products on the filter. The output of the display will thus provide a numerical or graphical output which is continuously increasing, the slope of the increase being the integral of the intensity of the radon gas over time passing through the system.

Figure 2:
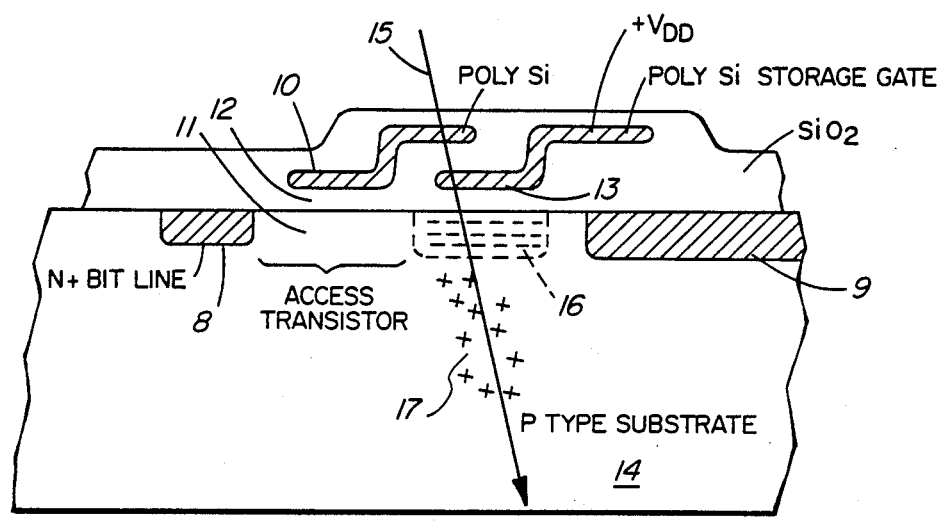
FIG. 2 is a cross section of a DRAM cell.

FIG. 2 illustrates the mechanism of recording a hit. Each cell of the DRAM is comprised of a source 8 and drain 9 region in a silicon substrate 14 separated by a channel region 11 adjacent the substrate surface. A conductive gate 10, e.g. formed of polysilicon, is separated from the channel region 11 by a layer of insulating dielectric e.g. silicon dioxide 12.

The sources 8 in a series of cells are connected together and as such are usually referred to as a bit line in the DRAM.

A second gate 13 is used to invert the surface region of the substrate 14, and thus cause a channel to be created between the source and drain. This effect turns the transistor cell on, which is considered to be the storage of a "O". When the channel is not in existence, with the transistor cell off, the cell is relaxed, and is considered to have stored a "1". The gate 10 is used to sample the state of the transistor and determine whether it contains a "1" or a "0".

Thus, for example, in an N-channel MOS device, a negatively charged channel will not exist at the surface of the substrate while the cell is in its off, "1" storing, state.

However, consider now the case in which an alpha particle impinges the surface of the device, along track 15. The positively charged alpha particle repels positive charges or holes from the channel region, leaving the channel negatively charged e.g. in region 16, and depositing the positive charges in the substrate region 17. This creates an N-channel, turning on the transistor, and thus the reversal of the storage from a "1" to a "0". It is this effect which is made use of in the present invention. Clearly in prior art DRAMs where "0"s are stored in half the empty cells to signify the storage of "1"s, a hit by an alpha particle will not be registered since it simply enhances the already existing N-channel.

In the present invention all the storage cells of the memory are placed in their relaxed (discharged) state, no matter what the apparent reading of the output memory is, in the loading portion of the cycle. Thus when the DRAM is read, the number of cells changed from the fully relaxed state are an indication of the alpha count registered on the device. The addressing scheme for the DRAM which is to be used in order to fully relax the memory should thus be predetermined before loading "1"s into each cell. In a successful prototype which is described herein, a 256K bit optical sensor DRAM was used, type IS256. The basic DRAM being supplied by Micron Technology Inc. of Boise, Id., which DRAM was modified to suit the invention as will be described.

Turning now to FIGS. 3 and 4, a clock generator 20, e.g. operating at 20 MHz, applies its signal to a divider 21 which produces a preferably 400 nanosecond timing signal. This signal, with the clock signal, which applies to a binary divider 22, applies signals to the D input of flip-flops 23, 24 and 25, which provides, respectively, at their Q outputs, a CAS, RAS and MUX signal respectively.

The CAS signal is applied to the 1A input of 8 bit address generation counter 26, which is connected in series with address generating counter 27. The outputs of address counters 26 and 27 are connected to the inputs of multiplexers 28, 29 to generate 9 bit row and column addresses, applied to the address inputs A0–A8 of DRAM 30. The CAS and RAS signals are inverted by inverters 31 and 32, and are phased to DRAM 30 in order to control the direction of the address input in the DRAM, i.e. either to columns or rows.

An output of address counter 26 produces a "1" at the time of generation of the address, which is inverted and applied to the data D input of DRAM 30. That data signal is also applied to a comparator 33 comprised of an exclusive OR gate 33. The other input of comparator 33 is connected to the Dout data output terminal of DRAM 30.

The DRAM 30 is of the type described above, which is devoid of an alpha particle absorbing layer, such as a polyimide or glass layer. The addresses generated by means of the address counter and multiplexers for storage of data in the DRAM, should be predetermined such that "1"s and "0"s are directed to the appropriate addresses in the DRAM so that all of the cells in the DRAM are placed into their relaxed state, notwithstanding the published specifications for the DRAM concerning storage of "1"s which, as was noted earlier, will not result in all of the storage cells being in their relaxed state in the case of a memory devoid of data, due to the memory and coding scheme typically used. The particular memory map or address scheme to be used in order to ensure that each cell is relaxed, that is, that no channel, i.e. MOS transistor, is conductive can be obtained from the manufacturer of the DRAM.

In a successful prototype of the invention, a 256K DRAM was used, in which the glass cover layer was removed. A 12 micron thick MYLAR ™ polyester film layer was substituted for the glass cover, in order to allow the alpha particles to pass through, which the glass cover would stop, and prohibit the device from being operable in the way intended for this invention.

The Data Sheet IS256 Rev 2 effective Mar. 1, 1986 published by Micron Technology Inc. illustrates for the RAM product IS256 a map of which cells store 0's to register a "1" and which store 1's to register a "1", and is incorporated herein by reference. Clearly those cells registering 0's to store 1's are not relaxed. To make the present invention, the logical levels should be applied to counteract this map, and cause each cell to become relaxed. The resulting storage array is then read accordingly, in order to determine which cells have become changed. Thus to relax a cell which the memory map indicates is charged (stores a 0) to indicate storage of a 1, the cell should be driven to store a zero, so as to actually relax (discharge the cell).

Comparator 33 compares the read data output from DRAM 30 with the data input to the DRAM. In the case in which all "1"s are to be stored, the data output will be a "1" unless an alpha particle hit has occurred in a particular cell in which case a "0" will be read. The comparator then registers a difference, the data signal thereof being applied to an error strobe flip-flop 34. The output of flip-flop 34 is applied to a sequence of counter registers 35, which stores a count of the number of "0"s, or difference read on the error strobe flip-flop 34, i.e. hits, registered in DRAM 30.

The read/write cycle of the DRAM is controlled by a delay circuit connected to the /W input of DRAM 30. Address controller terminal A15 of address counter 27 is connected through inverter 36 to the clock input of flip-flop 37. The output of converter 38 is connected to one input of NOR gate 47 and through the input of inverter 39, the output of which is connected to the /W read/write input of input DRAM 30.

The Q output of flip-flop 37 is also connected to the clock input of flip-flop 41, the Q output of which is connected to the clock input of flip-flop 42 and through inverter 43 to the clock input of flip-flop 44. The Q output of flip-flop 44 is connected to one input of NAND gate 45, and the Q output of flip-flop 42 is connected through inverter 46 to the other input of NAND gate 45. The output of NAND gate 45 is connected through inverter 46 to one input of NAND gate 47, which input is connected to the second input of NAND gate 40. The output of NAND gate 40 is connected to one input of NOR gate 48, which has its output connected to the CLR (clear) input of error strobe flip-flop 34.

The CAS lead is connected to an input of NOR gate 49, which has a second input connected to the output of inverter 32.

The circuit comprising the elements 37–47 comprise a time delay circuit which generates a delay signal which controls the read/write cycle of the DRAM. This circuit also controls the enable/disable input of the error strobe flip-flop through NOR gate 48. Thus the error strobe flip-flop for the duration of the access of the DRAM, typically 150 nanoseconds.

By means of the above, the DRAM operates over a cycle preferably as follows: (a) read the DRAM, (b) write to the DRAM to store data in all storage locations in order that every cell is relaxed (nominally all "1"s), (c) wait for a significant period of time, e.g. about 1 second, in order to allow alpha particles collected on filter 3 due to radon gas being passed therethrough to impinge the surface of the DRAM, (d) read the DRAM (refreshing it), allowing the comparator to provide an output signal corresponding to the number of hits encountered by the memory, cell channel inversions, i.e. nominal "0"s stored, (e) write to the DRAM to relax all cells, then repeat the entire cycle. One cycle typically can take a little under 1 second.

Preferably a well known LCD display with display drivers are connected to the output of counter registers 35. As the counter registers increment, as the hit count increases, the LCD display will exhibit an increase in displayed value. While an alphanumeric display of the total number of hits can be used, alternatively a graphical display can be used and/or a data recorder to record the count.

The alphanumeric or graphical value shown on the display preferably is modified by a calibration factor as described earlier, in order to output mWL. If desired, in addition or alternatively, the scope of the increase in the count can be calculated and displayed.

The filter 3 should be removed in order that a count based on the old sample values should not be accumulated FIG. 5 is a graph showing the typical output of the present invention as curve 50, against readings of actual radon daughter concentration shown by curve 51, over a period of 48 hours. A diurnal variation is evident. The average of the curve 51 is virtually identical to the slope of the curve shown by the output of curve 50 given by the present invention The slight variation from a linear curve 50 at the early measurement time can be accounted for by setting WL equal to "alpha counts"/(Ts-0.5)CF, where Ts is a sampling time in hours (one hour or greater) and CF is the calibration factor in counts per hour per milli-WL (i.e. cph/mWL).

The instrument described above can be used for relatively quick measurements, since it has been found that it will read about 80 counts in the first hour at the EPA first action level 20mWL. The same instrument can be used for longer time-integrated measurement in order to determine longer variation of WL.

The present invention is also useful as a basic element in an instrument for reading radon gas directly. In the apparatus so far described, the radon gas itself passes through the filter, while daughter products, which result from the decay of radon gas, is measured. However it is sometimes desired to obtain an indication of the presence or intensity of radon gas itself. J. Bigu and R. Raz, in REV.SCI.INSTRUM. 56(1), January 1985 published by the American Institute of Physics, P.146f–153 in an article entited PASSIVE RADON/THORON PERSONAL DOSIMETER USING AN ELECTROSTATIC COLLECTOR AND A DIFFUSED-JUNCTION DETECTOR describe a system in which the decay products of radon, thoron and other unwanted airborne particles including water vapour are filtered before the remaining atmosphere is presented to their alpha detector. A cylindrical screen supporting the membrane filter is grounded and an electrostatic collector which seals the end of the cylinder is charged to −430 volts. Radon gas devoid of daughter products diffusing through the membrane and into the volume surrounded by the grounded metallic grid decays, producing daughter products. The daughter products being positively charged relative to the electrostatic collector located in front of the alpha detector are attracted to the electrostatic collector. The alpha detector, in counting alpha particles from the radon gas daughter products, is determined by the detector.

The authors utilize an alpha detector described as a thermo-luminescent detector, a track etch detector such as cellulose nitrate, or a silicon diffused-junction or surface-barrier detector. Yet the structure is described as being suitable for personal and environmental random monitoring. Such detectors suffer from the problems described earlier in this specification, such as requiring reading long past the time of exposure (which thus is useless as an alarm in a relatively real time environment, or is very expensive and/or requires a high degree of power requirement and large size, which prohibits its wide spread use as a personal detector or in the home).

An embodiment of the present invention is an improvement to the above. In this embodiment a prefilter for radon daughters is used. Also used is a dynamic random access memory devoid of an ionizing radiation absorbing layer, such as an optical DRAM for exposure to daughter products of the radon gas introduced into the environment of the dynamic random access memory which has been cleansed of daughter products Thus the daughter products detected by the DRAM relate to the radon gas itself rather than the previously present daughter products Electrostatic means is provided to attract the newly generated daughter products to a screen or other collector of radon daughter products located in front of the DRAM. As described earlier, the system includes means for relaxing all actual cells of the DRAM which are to be used to detect the radon daughter products and means for reading the cells of the DRAM after exposure thereof to the daughter products to determine an indication of the degree of ionizing radiation particles in the environment of the DRAM resulting from the previously cleansed radon gas.

Turning to FIG. 6, one form of this embodiment is shown in section. An impermeable electrically conductive tube 60 has a semi-permeable membrane 61 closing one end. That semi-permeable membrane can be formed of e.g. polystyrene packing about 5 mm thick or a Whatman glass filter of 0.8 micron pore size, for example. The membrane 61 should stop radon gas daughter products but allow radon gas to pass through. Thus a filter having 0.8 micron pores will suffice.

The conductive tube 60 can be formed of metallized Mylar TM polyester film. A conductive mesh series 60A in conductive contact with the metallization of the metallized Mylar TM polyester film should close the tube on the inside of the tube.

A DRAM 62 which is devoid of an ionizing radiation absorbing layer is located at the other end of tube 60 from filter 61, as is connected to control and display apparatus 63. In front of the DRAM 62 is a conductive plate 64. The end of the tube 60 at which the DRAM 62 is located is closed, except for a port connected to a pump 64A.

The tube 60 is charged to approximately +400 V, while the plate 64 is grounded. Pump 64A lowers the pressure within tube 60, drawing environmental gases through membrane 61. Membrane 61 allows any radon gas to pass therethrough, as depicted by arrows 65, but stops alpha particles, thus cleansing the radon gas. The radon gas within the tube 60 decays, producing daughter products. Due to the electrostatic charge difference between the conductive tube 60 and plate 64, the daughter products collect on plate 64, emitting alpha particles which impinge into DRAM 62. DRAM 62 operates as described earlier, after having all its cells relaxed, its cells being charged by the ionizing radiation particles emitted by the radon gas daughter products. The control and display 63 operate as described earlier.

Pump 64A should be relatively weak, in order to allow the radon gas within the tube 60 sufficient time to decay before being swept out of the tube. If desired, another semi-permeable membrane (i.e. radon daughter product filter) can be placed in front of the port leading to pump 64A, or can surround plate 64 to the edges of tube 60.

Plate 64 can be formed of aluminized mylar sheet and must be sufficiently thin to allow ionizing radiation to pass therethrough and into the DRAM.

FIG. 7 illustrates an embodiment of the invention which is suitable for use in a home, and eliminates the use of the pump 64A. A cylinder 66 having one end closed is formed of conductive screen. A filter 67 having approximately 0.8 micron pore size covers the screen including the end wall of the cylinder. The filter 66 can be formed of Whatman glass with 0.8 micron pore size, about 5 mm thick polystyrene packing, or other filter material which is permeable to radon gas but not to its radioactive daughter products Instead of screen material metallized MYLAR ™ polyester film can be used which has holes punched in it to allow radon gas to pass through the holes. The metallization should be on the inside of the cylinder and end wall.

The other end of the cylinder is preferably impermeably closed. However instead of impermeably closing it, it can be formed of the screen or metallized MYLAR ™ polyester film as described above covered with a radon gas daughter product filter.

Typically the closed wall 68 is attached to the vertical wall of a structure, such as a house, in which the presence of radon gas is to be detected. Local air currents indicated by the double lined arrows 68 which have molecular and particle sizes less than 0.8 micron slowly pass through the filter 67 and the spaces between the screen elements or the holes in the mylar. The air movement rate is typically very slow.

Within the volume of the chamber defined by the screen or metallizated Mylar a DRAM 62 is located as described above, having an electrically conductive plate 64 (formed cf e.g. metallized MYLAR ™ polyester film located adjacent to its front. Control and display 63 similar to that described earlier is connected to DRAM 62.

In operation, as described earlier, local air currents shown by double lined arrows 69 pass through the filter and holes in the cylinder 66. Radon daughter products are filtered by filter 67, resulting in cleansed radon gas (should there be any in the air currents) being contained within the cylinder. Due to the very slow movement of air, there is sufficient time for the radon gas to decay into daughter products, which typically takes approximately three hours.

The conductive layer or screen of cylinder 66 is charged to e.g. +400 V, while plate 64 is grounded. The result of this electrostatic difference is the migration of radon gas daughter products to plate 64, as shown by arrows 70. The radon gas daughter products collect on plate 64, and the ionizing radiation therefrom impinges into DRAM 62 whose cells have been relaxed by means of the control of control and display 63, in a manner described above. The result is charging of cells of the DRAM, which are read and displayed by control and display apparatus 63, in a manner as is also described above.

The structure can be hung on the wall of a dwelling, with the display immediately visible to the user. Further, as described earlier, once a threshold has been exceeded, an alarm can be set off. The apparatus thus can be used in a household in a manner similar to a smoke alarm, to warn of excessive radon gas. Because a pump is not required as in FIG. 6, battery current is conserved and noise is eliminated, since only local air currents are required to present the radon gas to the apparatus. Because a DRAM is used in a manner as described above, the cost for the apparatus can be extremely low, allowing it to be sold at a price inexpensive enough for widespread distribution.

The present invention has proved to be a significant addition to the arsonal of public safety in that for the first time a highly inexpensive, portable instrument which consumes very little power can be placed in homes and other locations in order to accurately determine the radon level therein.

A person skilled in the art understanding this invention may now conceive of alternative embodiments or variations thereof. All are considered to be within the sphere and scope of the invention as defined in the claims as appended hereto.

I claim:

1. For use in an ionizing radiation particle detector, a dynamic random access memory (DRAM) devoid of an ionizing radiation absorbing layer for exposure to said particles, means for relaxing all actual cells of the DRAM which are to be used to detect said particles, and means for reading the cells of the DRAM after exposure thereof to said particles to determine an indication of the degree of ionizing radiation particles impinged on the DRAM.

2. For use in a detector as defined in claim 1, the means for relaxing including means for storing all "1"s in said cells.

3. For use in a detector as defined in claim 1, means for waiting for a significant period of time after relaxing said cells, then for reading the DRAM to both determine the number of charged cells caused by said particles and to refresh the DRAM.

4. For use in a detector as defined in claim 3, a Radon daughter product filter located adjacent said DRAM, and means for passing a medium carrying Radon daughters through the filter, whereby said Radon daughters can be trapped in the filter and alpha particles emitted therefrom charge cells of the adjacent DRAM.

5. An instrument as defined in claim 1, 2 or 3, including means for cleansing existing radon daughter products from said gas, means for retaining the cleansed gas in the environment of said DRAM for a time sufficient for at least some of the radon gas to decay into fresh daughter products for exposure to said DRAM.

6. An instrument as defined in claim 1, 2 or 3, including means for cleansing existing radon daughter products from said gas, means for retaining the cleansed gas in the environment of said DRAM for a time sufficient for at least some of the radon gas to decay into fresh daughter products for exposure to said DRAM, the means for retaining including a conductive chamber for surrounding the cleansed gas and a conductive plate adjacent the DRAM, the chamber being charged positively relative to the plate.

7. A method of detecting alpha particles comprising:
   (a) relaxing all cells of a DRAM having no surface radiating particle absorbing layer,
   (b) waiting for a significant period of time before refreshing the DRAM, while alpha particle hits charge cells of the DRAM,
   (c) reading the DRAM content to register the number of charged cells,
   (d) repeating steps (a), (b) and (c).

8. A method as defined in claim 7 in which the waiting step is about 1 second.

9. A method as defined in claim 8 in which the DRAM is a nominally 250K cell DRAM, and the read and write cycle each takes about 200ms.

10. A method as defined in claim 7, 8 or 9, including the steps of cleansing existing radon daughter products from said gas, retaining the cleansed gas in the environment of the DRAM for a time sufficient for at least some of the radon gas to decay into fresh radon daughter products, and exposing the fresh radon daughter products to the DRAM.

11. A method as defined in claim 7, 8 or 9, including the steps of cleansing existing radon daughter products from said gas, retaining the cleansed gas in the environment of the DRAM for a time sufficient for at least some of the radon gas to decay into fresh radon daughter products, and electrostatically drawing the fresh radon daughter products into the vicinity of the DRAM to expose the fresh radon daughter products to the DRAM.

12. A radon gas detector instrument comprising:
(a) a filter for trapping Radon daughters of said gas,
(b) an air pump for drawing ambient air through the filter,
(c) a DRAM devoid of an alpha particle barrier layer, located adjacent the filter, for exposure to alpha particles trapped by the filter,
(d) means for cyclically relaxing all cells of the DRAM, waiting for a significant period of time for cells of the DRAM to become charged by said alpha particles, then reading the DRAM to determine the number of charged cells in the DRAM,
(e) a display connected to the relaxing, waiting and reading means for displaying a count of the number of charged cells in units correlated to the intensity of radon gas in the ambient air.

13. An instrument as defined in claim 12 in which the DRAM is an N channel MOS memory.

14. An instrument as defined in claim 13 in which the (d) means includes means for relaxing each of the cells of the DRAM by storing "1"s in each cell of the memory, and for reading the number of "0"s as said charged cells.

15. An instrument as defined in claim 14 in which the (d) means is comprised of an address controller, multiplexer driven by the address controller for addressing the DRAM, means for generating data "1"s, means for applying said "1"s to the data input of the DRAM during a write cycle, counter registers, a comparator for comprising data read from the DRAM with said data "1"s during a read cycle, a strobe for receiving the output from the comparator and applying it for storage to the counter registers, and a read/write controller for controlling the read/write/wait intervals of the DRAM and for inhibiting strobe of the DRAM during the access time of the DRAM, a source of clock signals for synchronizing the relaxing, waiting and reading means, and a display connected to the counter registers for receiving and displaying a count stored therein.

16. An instrument as defined in claim 12 in which the DRAM is a silicon solid state image sensor, and comprising a polyester film cover over the sensor of sufficient thickness to pass alpha particles but to substantially stop ambient contaminants from penetrating therethrough.

17. An instrument as defined in claim 12 in which the DRAM is a silicon solid state image sensor, and comprising a polyester film cover over the sensor about 12 microns thick.

18. A radon gas detector instrument comprising:
(a) a chamber having conductive, electrically chargeable walls,
(b) a filter located at an inlet to the chamber for radon daughters for allowing cleansed radon gas devoid of radon daughters into the chamber,
(c) a DRAM devoid of an alpha particle barrier layer, located within the chamber,
(d) a conductive plate located adjacent the front of the DRAM,
(e) means for charging the chargeable walls positively relative to the chargeable plate
whereby said cleansed radon gas is allowed to decay and form daughter products within the chamber, the daughter products being electrostatically drawn to said plate and thereby into the close vicinity of DRAM, exposing the DRAM to alpha particles emitted by said daughter products,
(f) means for cyclically: relaxing all cells of the DRAM, waiting for a significant period of time for cells of the DRAM to become charged by said alpha particles, then reading the DRAM to determine the number of charged cells in the DRAM,
(g) a display connected to the relaxing, waiting and reading means for displaying a count of the number of charged cells in units correlated to the intensity of radon gas in the ambient air 19. An instrument as defined in claim 18, further including a fan attached to an exit port to the chamber for slowly drawing gas out of the chamber, thus causing gas to pass through said filter into the chamber.

20. An instrument as defined in claim 18, in which the chamber is formed of metallic screen.

21. An instrument as defined in claim 18, in which the chamber is lined with a metallized polyester film foil, covered with said filter, and containing holes for allowing ingress and egress of said cleansed gas.

* * * * *